United States Patent [19]

Zehner

[11] 4,398,275
[45] Aug. 9, 1983

[54] LINEAR FREQUENCY SWEEP GENERATOR FOR CONTINUOUS TRANSMISSION FM SONAR

[75] Inventor: William J. Zehner, Lynn Haven, Fla.

[73] Assignee: The United States of America as represented by the Secretary of the Navy, Washington, D.C.

[21] Appl. No.: 307,923

[22] Filed: Oct. 2, 1981

[51] Int. Cl.³ .................. G01S 7/52; H03B 23/00
[52] U.S. Cl. .................... 367/137; 367/102; 331/178
[58] Field of Search .......... 367/102, 137, 138; 331/178

[56] References Cited

U.S. PATENT DOCUMENTS

| | | | |
|---|---|---|---|
| 2,977,568 | 3/1961 | Roshon, Jr. et al. | 367/102 |
| 3,413,453 | 11/1968 | Thorpe | 235/150.53 |
| 3,530,404 | 9/1970 | Abruzzo et al. | 331/178 |
| 3,739,374 | 6/1973 | Kiowski | 331/178 |
| 3,792,378 | 2/1974 | Hughes et al. | 331/178 |
| 3,885,138 | 5/1975 | Bates | 235/150.53 |
| 4,038,612 | 7/1977 | Borofka et al. | 331/178 |

Primary Examiner—Richard A. Farley
Attorney, Agent, or Firm—Robert F. Beers; Harvey A. David

[57] ABSTRACT

A device for producing a varying frequency sine wave synthesized so that the frequency is swept linearly with time for use in a continuous transmission FM sonar. A crystal clock, divider and a 16 bit digital output sweep cointer produce $2^{16}$ counts for each sweep period $T_s$. The $2^{16}$ counts are applied to a 16 bit digital to analog converter to provide a highly linear voltage ramp (the smoothed result of $2^{16}$ steps). The ramp is converted to a proportional frequency which is applied to a 5 bit digital counter to access a read only memory programmed to provide a digital output representing points along a sine wave. The memory output is applied to a digital to analog converter to produce a voltage output that is a 32 stepped approximation of a sinewave at a frequency which increases betweeen $f_1$ and $f_2$ with the linearity of the ramp voltage. A filter smoothes the output.

7 Claims, 2 Drawing Figures

LINEAR FREQUENCY SWEEP GENERATOR FOR CONTINUOUS TRANSMISSION FM SONAR

BACKGROUND OF THE INVENTION

This invention relates to continuous transmission frequency modulated (CTFM) echo ranging systems, and more particularly to sonic ranging systems which produce a continuous target indication.

The echo ranging systems used in the past for locating underwater objects have operated on the principle of transmitting sound energy in the direction of the target and receiving a portion of the transmitted energy which is reflected back from the target. Since sound waves in ocean water travel at a substantially constant rate of about 1500 meters per second, the difference between the time of transmission of the sound energy and the time of reception of the relfected energy provides an accurate measure of the range to the target. Some of those ranging systems transmitted a series of discrete pulses separated in time from each other by an interval more than the transit time of the energy to and from a target at the maximum range of the equipment, and since the propagation rate of sound in ocean water is slightly less than a mile per second, the spaces between pulses must be several seconds. Such a system is therefore capable of searching an area only at very low speeds, although the operating range may be quite considerable.

However, from many applications the slow rate of search of the pulses sonic echo systems is a distinct disadvantage in maintaining contact with targets and, to overcome these disadvantages, frequency modulated systems have been devised. These systems, an example of which is provided in U.S. Pat. No. 2,977,568, employ a continuously radiating sinusoidal oscillator whose frequency is caused to vary cyclically between fixed limits. The reflected energy has the same frequency as the energy impinging on the target, and is combined with the output of the oscillator to produce a heterodyne or heat frequency. It will be apparent to those skilled in the art that the reflected energy will be delayed by the transit time to and from the target, and will therefore be of a different frequency than that of the oscillator, and that the difference $\Delta f$ between the two frequencies will be a measure of the distance to the target. This is illustrated in FIG. 1.

The range resolution of a CTFM sonar is proportional to the number of band pass filters which are used to separate the different frequency echoes into range bins. For a given transmitted bandwidth, range resolution increases as more filters are added and the bandwidth of each is decreased. However, as more filters are added in an effort to achieve better range resolution, the linearity of the transmitted frequency sweep becomes more critical, because nonlinearity causes an error in the frequency difference between the transmitted signal and the echo signal. The result is that a target appears to wander back and forth through several range bins during the sweep time ($T_S$). Conventional techniques, using a voltage ramp generator driving a voltage controlled oscillator, having rarely achieved 0.1% linearity, which is still inadequate for modern high-resolution sonars.

U.S. Pat. Nos. 3,530,404; 3,885,138; and 4,038,612 provide discussions and specific prior art examples of different approaches to highly linear FM sweep generation. In general, the techniques have relied on various forms corrective feedback, digital multiplication, and periodic phase coincidence comparison.

The manner in which the present invention achieves the desired signal generation will become apparent as this specification proceeds.

SUMMARY OF THE INVENTION

With the foregoing in mind, it is a principal object of this invention to provide a means for generating a highly linear frequency sweep for a continuous transmission frequency modulated sonar.

Another object of this invention is to avoid the need for complex corrective feedback systems, phase comparators, and the like.

Still another object is the provision of an inexpensive, yet reliable and accurate, linearly varying signal generator that provides well formed frequency swept sine wave output signals.

As yet another object, the invention aims to accomplish all the foregoing through a novel combination of elements which cooperate in a unique manner to synthesize the desired variable frequency waveform.

Other objects and many of the attendant advantages will be readily appreciated as the subject invention becomes better understood by reference to the following detailed description, when considered in conjunction with the accompanying drawings.

DESCRIPTION OF THE PREFERRED EMBODIMENT

Figure 1:
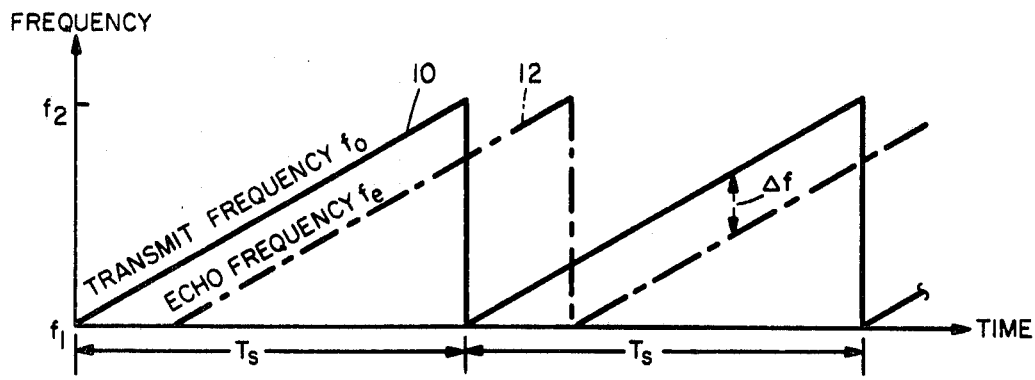
FIG. 1 is a graphic illustration of the frequency/time relationship between transmitted signals and received echo signals of a typical CTFM sonar.

Referring briefly first to FIG. 1, the sawtooth curve 10 represents the transmitted output frequency $f_o$ that is swept repeatedly through the range of frequencies $f_1$ to $f_2$ during each successive sweep period $T_s$. The received echo signal frequency $f_e$ returned from a given target is represented by the dot and dash curve 12 and is displaced in time relative to the transmit frequency by an amount related to the range of the target. As is understood by those familiar with the art to which the invention pertains, the range is determined by detection of the difference $\Delta f$ between the transmitted and returned frequencies. As mentioned earlier in the background discussion, the greater the resolution with which that difference is detected, the more important it becomes that the frequency sweep of transmitted signals be linear through the range of $f_1$ to $f_2$. In accordance with the present invention, a sine wave is synthesized in such a manner that the frequency $f_o$ thereof changes very linearly with time.

Figure 2:
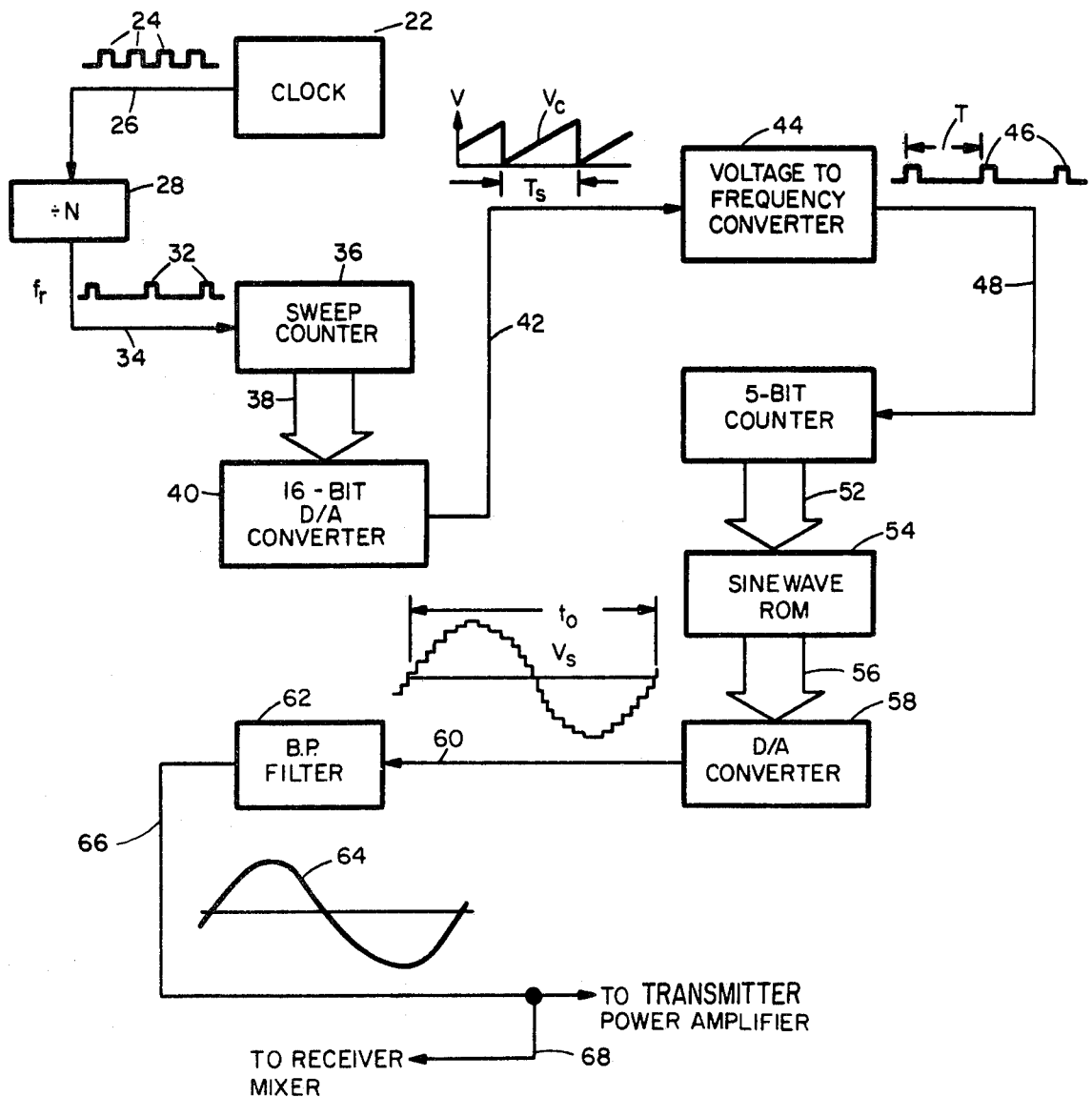
FIG. 2 is a diagrammatic illustration, in block form, of a highly linear, frequency sweep generator embodying the present invention.

Referring now to FIG. 2, an example of a highly linear, frequency sweep generating circuit 20, suitable for use in a continuous transmission frequency modulated sonar, comprises a crystal controlled oscillator or other stable source 12 of clock pulses 24 at a predetermined rate or clock frequency $f_c$. The clock pulses 24 are applied, as shown by line 26, to a divider 28 which reduces the clock frequency by a factor N to provide output pulses 32 at a step rate frequency $f_r$. The pulses 32 are applied, as shown by line 34, as an input to a sweep counter 36. Counter 36, which is of a conventional binary type, has a 16 bit digital output, represented by broadline 38, or $2^{16}$ counts for each sweep period $T_s$, applied to a commercially available 16 bit digital-to-analog converter 40.

The converter 40 provides a voltage ramp output $V_c$, line 42, that is the smoothed result of $2^{16}$ voltage steps, that are so accurately similar and accurately spaced by the step rate frequency pulses 32, that the voltage ramp $V_c$ is highly linear. The voltage ramp $V_c$ is applied to a highly linear, commercially available voltage to frequency converter 44, the output of which is a series of pulses 46 on line 48, the repetition periods $\tau$ of which are inversely proportional to the voltage of the input ramp. Thus, the pulse frequency $f_c = 1/\tau = KV_c$, where K is a constant.

The pulses 46 are applied to a 5 bit digital counter 50, the output 52 of which is in the form of a binary word representative of the pulse frequency $f_c$ and is used to access an ROM (read only memory) 54. The ROM 54 is programmed to provide a digital (binary word) output 56 representing points along a sinewave corresponding in frequency with the binary word input 52. The output 56 of ROM 54, of course, changes with changes in the input 52, and is applied to a digital to analog converter 58 that produces a voltage output $V_s$ on line 60 that is a 32 stepped approximation of sinewave having a period $t_o$ and a frequency $f_o$, where $$f_o = 1/t_o = f_c/32.$$

The synthesized, stepped sinewave output $V_s$ of converter 58 is bandpass filtered at 62 to provide the desired frequency modulated output signal 64, having a swept frequency $f_o$ that increases in frequency with the same linearity as is exhibited by the output $V_c$ of the digital to analog converter 40. The output 64 is fed via line 66 to drive the transmitter power amplifier and via line 68 to serve as the reference with which the received signals are mixed to obtain $\Delta f$ in a known manner.

From the foregoing description, it will be recognized that the invention achieves improved linearity in generation of the frequency modulated output through the novel combination of digital means, including ROM, to synthesize the varying frequency sinewave.

Obviously, other embodiments and modifications of the subject invention will readily come to the mind of one skilled in the art having the benefit of the teachings presented in the foregoing description and the drawing. It is, therefore, to be understood that this invention is not to be limited thereto and that said modifications and embodiments are intended to be included within the scope of the appended claims.

I claim:

1. A linearly swept frequency signal generator for use in an FM sonar, said generator comprising:
   a source of first pulses at a first frequency;
   first counter means, responsive to said first pulses, for repeatedly counting to a predetermined count;
   means, responsive to the changing count in said first counter means, for providing incremental changes in a voltage ramp output;
   means, responsive to said voltage ramp output, for providing second pulses at a second frequency that changes in pulse rate with the voltage of said voltage ramp output;
   second counter means, responsive to said second pulses, for providing a digital output corresponding with the pulse rate of said second frequency;
   memory means, responsive to said digital output of said second counter means to provide a digital output corresponding to successive points along a predetermined cyclical waveform that changes in frequency in accordance with changes in said second frequency; and
   means, responsive to said digital output of said memory means, for providing a carrying voltage output as said linearly swept frequency signal.

2. A signal generator as defined in claim 1, and wherein:
   said first and second counter means comprise binary digital counters.

3. A signal generator as defined in claim 2, and wherein:
   said means, responsive to the changing count in said first counter means comprises a binary digital to analog converter.

4. A signal generator as defined in claim 3, and wherein:
   said means, responsive to said voltage ramp output comprises a digital voltage to frequency converter.

5. A signal generator as defined in claim 4, and wherein:
   said means, responsive to said digital output of said memory means comprises a binary digital to analog converter.

6. A signal generator as defined in claim 5, and wherein:
   said memory means comprises a read only memory and said cyclical waveform comprises a sinewave.

7. A frequency sweep generator for use in a continuous transmission FM sonar, the generator comprising in combination:
   a source of clock pulses;
   means for reducing the clock pulses to a step rate frequency;
   first binary counter means, responsive to the step rate frequency to provide a multiple bit binary word that repeatedly counts to a predetermined count;
   first digital to analog converter means, responsive to the changing count in said first binary counter means, for providing a repeating voltage ramp output formed from discrete voltage steps corresponding to said step rate frequency;
   voltage to frequency converter means, responsive to said voltage ramp output, for pvoviding pulses at a correspondingly changing frequency proportional to;
   second binary counter means, responsive to said pulses to provide a multiple bit binary count that changes count at rate determined by said changing frequency;
   a read only memory means, responsive to the counts in the second binary counter means to provide corresponding binary word outputs representative of points on a sine wave;
   second digital to analog converter means, responsive to the binary word outputs of said read only memory, for providing a stepped analog voltage level approximation of a varying frequency sine wave; and
   filter means for smwothing the output of said second digital to analog converter to provide the desired waveform for FM sweep modulation of a sonar.

* * * * *